United States Patent [19]
Lindberg et al.

[11] Patent Number: 5,831,409
[45] Date of Patent: Nov. 3, 1998

[54] ELECTRIC VEHICLE PROPULSION SYSTEM EMPLOYING AC INDUCTION MOTOR CONTROL

[75] Inventors: Frank A. Lindberg, Baltimore; David L. Schantz, Jr., Ellicott City; Brian H. Smith, Arnold; Charles S. Kerfoot, Pasadena; Joseph J. Springer, Bel Air; Patricia A. O'Donnell, Davidsonville; James H. DeOms, Glen Arm; Ronnie L. Starling, Columbia; Michael J. Ankrom, Baltimore; James L. Munro, Severna Park; Geoffrey B. Lansberry, Bowie; Beth A. Herman, Columbia; William B. Hall, Annapolis; Marshall G. Jones, Joppa; William B. Winkel; Brian A. DeAbreu, both of Bowie; Thomas C. Underwood, Laurel; Todd M. Zaranski, Baltimore; Aaron D. Valdivia, Woodstock; Richard M. Young, Millersville; Frank E. Altoz, Baltimore; Ngon B. Nguyen, Jessup; Eric L. Mohler, Annapolis, all of Md.

[73] Assignee: Northrop Grumman Corporation, Los Angeles, Calif.

[21] Appl. No.: 808,354

[22] Filed: Feb. 28, 1997

Related U.S. Application Data

[63] Continuation of Ser. No. 258,301, Jun. 10, 1994, abandoned.

[51] Int. Cl.⁶ .............................................. H02H 07/122
[52] U.S. Cl. ..................... 318/801; 318/811; 318/806; 180/65.8; 363/56
[58] Field of Search ................................. 318/139, 254, 318/798, 800, 803, 587, 811, 549, 810, 807, 802, 806, 808; 364/426.02, 426.03; 180/165, 197, 65.8, 65.1, 246, 76, 65.4; 363/50, 55, 56

[56] References Cited

U.S. PATENT DOCUMENTS

| | | | |
|---|---|---|---|
| 4,331,209 | 5/1982 | Bauer et al. | 310/63 |
| 4,959,570 | 9/1990 | Nakamura et al. | 310/54 |
| 5,172,784 | 12/1992 | Varela, Jr. | 180/65.4 |
| 5,229,677 | 7/1993 | Dade et al. | 318/432 |
| 5,294,875 | 3/1994 | Reddy | 318/801 |
| 5,376,868 | 12/1994 | Toyoda et al. | 318/587 |
| 5,414,339 | 5/1995 | Masaki et al. | 318/800 |
| 5,475,581 | 12/1995 | Lansberry | 318/801 |
| 5,481,194 | 1/1996 | Schantz et al. | 361/42 |
| 5,506,484 | 4/1996 | Munro et al. | 318/599 |
| 5,508,594 | 4/1996 | Underwood et al. | 318/139 |

*Primary Examiner*—John W. Cabeca
*Attorney, Agent, or Firm*—Walter G. Sutcliff

[57] ABSTRACT

An electric vehicle propulsion system having a motor with first and second electrically isolated windings and a system control unit for controlling the motor, wherein the system control unit includes a first power bridge for driving the first windings and a second power bridge for driving the second windings.

2 Claims, 6 Drawing Sheets

ELECTRIC VEHICLE PROPULSION SYSTEM EMPLOYING AC INDUCTION MOTOR CONTROL

This application is a continuation of application Ser. No. 08/258,301 filed on Jun. 10, 1994, now abandoned.

RELATED APPLICATIONS

The following identified U.S. patent applications are filed on the same date as the instant application and are relied upon and incorporated by reference in this application.

U.S. patent application entitled "Flat Topping Concept" U.S. Ser. No. (08/258,295) and filed on the same date herewith;

U.S. patent application entitled "Electric Induction Motor And Related Method Of Cooling" U.S. Ser. No. (08/258,150) and filed on the same date herewith;

U.S. patent application entitled "Automotive 12 Volt System For Electric Vehicles" U.S. Ser. No. (08/258,142) filed on the same date herewith;

U.S. patent application entitled "Direct Cooled Switching Module For Electric Vehicle Propulsion System" U.S. Ser. No. (08/258,027) and filed on the same date herewith;

U.S. patent application entitled "Speed Control and Bootstrap Technique For High Voltage Motor Control" U.S. Ser. No. (08/258,294), and filed on the same date herewith;

U.S. patent application entitled "Vector Control Board For An Electric Vehicle Propulsion System Motor Controller" U.S. Ser. No. (08/258,306) and filed on the same date herewith;

U.S. patent application entitled "Digital Pulse Width Modulator With Integrated Test And Control" U.S. Ser. No. (08/258,305) and filed on the same date herewith;

U.S. patent application entitled "Control Mechanism For Electric Vehicle" U.S. Ser. No. (08/258,149) and filed on the same date herewith;

U.S. patent application entitled "Improved EMI Filter Topology for Power Inverters" U.S. Ser. No. (08/258,153) and filed on the same date herewith;

U.S. patent application entitled "Fault Detection Circuit For Sensing Leakage Currents Between Power Source And Chassis" U.S. Ser. No. (08/258,179) and filed on the same date herewith;

U.S. patent application entitled "Electric Vehicle Relay Assembly" U.S. Ser. No. (08/258,117) and filed on the same date herewith;

U.S. patent application entitled "Three Phase Power Bridge Assembly" U.S. Ser. No. (08/258,117) and filed on the same date herewith;

U.S. patent application entitled "Electric Vehicle Propulsion System Power Bridge With Built-In Test" U.S. Ser. No. (08/258,034) and filed on the same date herewith;

U.S. patent application entitled "Method For Testing A Power Bridge For An Electric Vehicle Propulsion System" U.S. Ser. No. (08/258,178) and filed on the same date herewith;

U.S. patent application entitled "Electric Vehicle Power Distribution Module" U.S. Ser. No. (08/258,157), and filed on the same date herewith;

U.S. patent application entitled "Electric Vehicle Chassis Controller" U.S. Ser. No. (08/258,628) and filed on the same date herewith;

U.S. patent application entitled "Electric Vehicle System Control Unit Housing" U.S. Ser. No. (08/258,156 and filed on the same date herewith;

U.S. patent application entitled "Low Cost Fluid Cooled Housing For Electric Vehicle System Control Unit" U.S. Ser. No. (08/258,299) and filed on the same date herewith;

U.S. patent application entitled "Electric Vehicle Coolant Pump Assembly" U.S. Ser. No. (08/258,296) and filed on the same date herewith;

U.S. patent application entitled "Heat Dissipating Transformer Coil" U.S. Ser. No. (08/258,141) and filed on the same date herewith;

U.S. patent application entitled "Electric Vehicle Battery Charger" U.S. Ser. No. (08/258,154) and filed on the same date herewith.

BACKGROUND OF THE INVENTION

1. Field of the Invention

The present invention relates to a propulsion system. More particularly, the present invention relates to an electric propulsion system for use in electric vehicles. While the invention is subject to a wide range of applications, it is especially suited for use in electric vehicles that utilize batteries or a combination of batteries and other sources, e.g., a heat engine coupled to an alternator, as a source of power, and will be particularly described in that connection.

2. Description of the Related Art

For an electric vehicle to be commercially viable, its cost and performance should be competitive with that of its gasoline-powered counterparts. Typically, the vehicle's propulsion system and battery are the main factors which contribute to the vehicle's cost and performance competitiveness.

Generally, to achieve commercial acceptance, an electric vehicle propulsion system should provide the following features: (1) vehicle performance equivalent to typical gasoline-powered propulsion systems; (2) smooth control of vehicle propulsion; (3) regenerative braking; (4) high efficiency; (5) low cost; (6) self-cooling; (7) electromagnetic interference (EMI) containment; (8) fault detection and self-protection; (9) self-test and diagnostics capability; (10) control and status interfaces with external systems; (11) safe operation and maintenance; (12) flexible battery charging capability; and (13) auxiliary 12 volt power from the main battery. In prior practice, however, electric vehicle propulsion system design consisted largely of matching a motor and controller with a set of vehicle performance goals, such that performance was often sacrificed to permit a practical motor and controller design. Further, little attention was given to the foregoing features that enhance commercial acceptance.

For example, a typical conventional electric vehicle propulsion system consisted of a DC motor, a chopper-type motor controller, an independent battery charger, and a distributed set of controls and status indicators. Vehicle performance was generally inadequate for highway driving, acceleration was uneven, and manual gear-changes were required. In addition, regenerative braking was either not available or, at best, available only at high motor speeds. Also, each of the system components had its own cooling system that used forced air or a combination of forced air and liquid cooling. Moreover, the issues of volume production cost, EMI, fault detection, maintenance, control and status interfaces, and safety were generally not addressed in a comprehensive manner.

SUMMARY OF THE INVENTION

Accordingly, the present invention is directed to an electric vehicle propulsion system that substantially obviates one or more of the problems due to the limitations and disadvantages of the related art.

Features and advantages of the invention will be set forth in the description which follows, and in part will be apparent from the description, or may be learned by practice of the invention. The objectives and other advantages of the invention will be realized and attained by the method and apparatus particularly pointed out in the written description and claims thereof as well as the appended drawings.

To achieve these and other advantages and in accordance with the purpose of the invention, as embodied and broadly described, the invention provides for an electric vehicle propulsion system, comprising a motor assembly, a system control unit for controlling the motor assembly, and a cooling system for circulating oil from the motor assembly to the system control unit and back to the motor assembly.

In another aspect, the invention provides for an electric vehicle propulsion system, comprising a plurality of elements, a power source for supplying a first level of power, a power distributer for receiving the first level of power from the power source and for distributing the first level of power to at least one of the plurality of elements, and a power converter for receiving the first level of power from the power source, for converting the first level of power from the power source to a second level of power, and for distributing the second level of power to at least one of the plurality of elements.

In yet another aspect, the invention provides for an electric vehicle propulsion system, comprising a motor assembly including a 3-phase AC induction motor having first and second sets of identical, electrically isolated windings, and a system control unit for controlling the motor assembly, the system control unit including a first power bridge for driving the first set of windings and a second power bridge for driving the second set of windings.

In still another aspect, the invention provides for an electric vehicle propulsion system, comprising a motor assembly including a motor and a resolver, and a system control unit for controlling the motor assembly, the system control unit including a chassis controller for generating driver-initiated acceleration and braking requests, and a motor controller, the motor controller including at least one power bridge for driving the motor, for receiving the driver-initiated acceleration and braking requests from the chassis controller, for acquiring rotor position measurements from the resolver and current measurements from the at least one power bridge, and for generating pulse width modulated (PWM) voltage waveforms to drive the at least one power bridge in accordance with the driver-initiated acceleration and braking requests, the rotor position measurements, and the current measurements.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate a presently preferred embodiment of the invention and, together with the description, serve to explain the principles of the invention. In the drawings.

DESCRIPTION OF THE PREFERRED EMBODIMENT

Reference will now be made in detail to a present preferred embodiment of the invention, an example of which is illustrated in the accompanying drawings.

Figure 1:
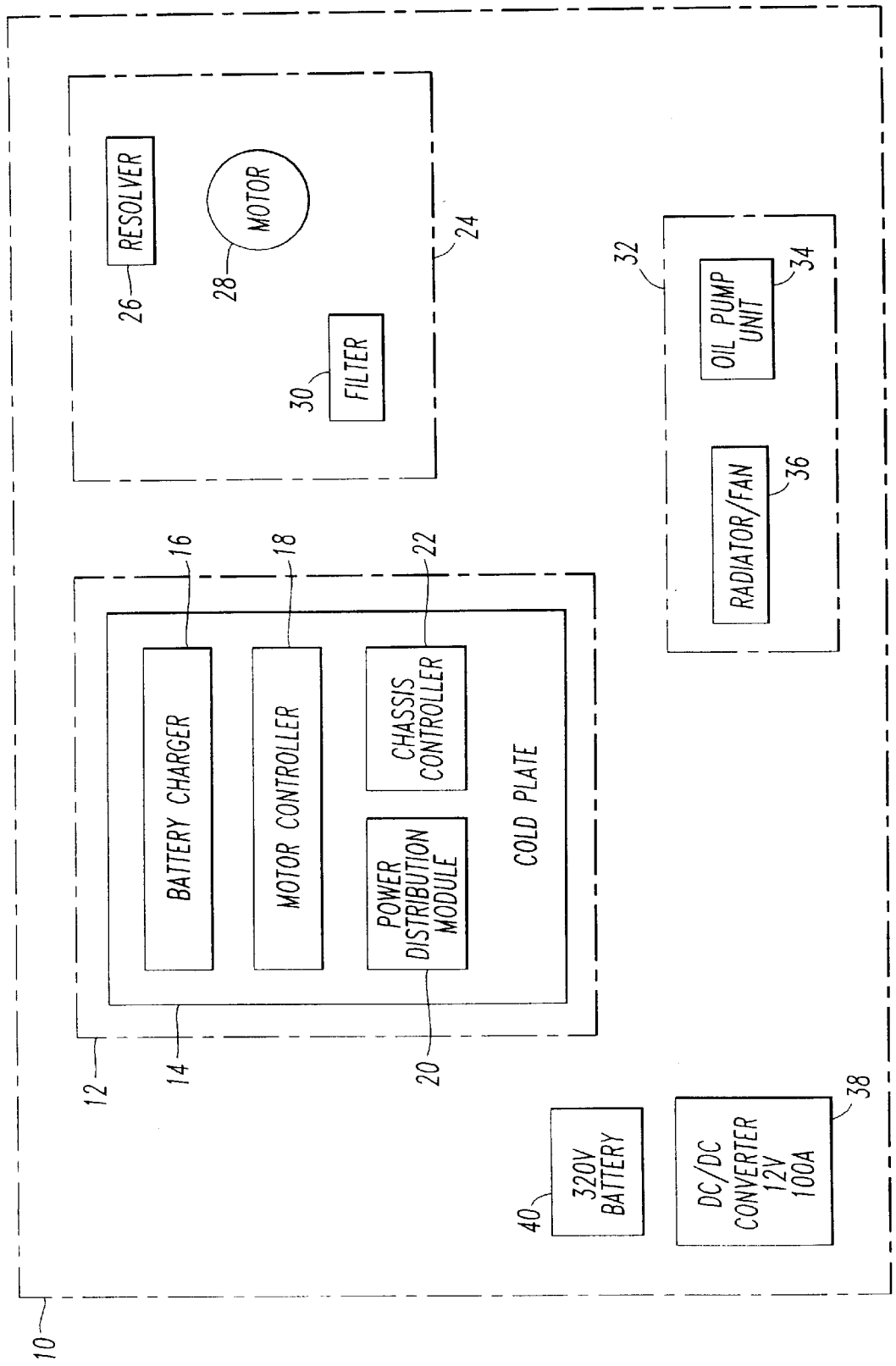
FIG. 1 is a block diagram of an electric vehicle propulsion system in accordance with a preferred embodiment of the invention.

As shown in FIG. 1, there is provided an electric vehicle propulsion system 10 comprising a system control unit 12, a motor assembly 24, a cooling system 32, a battery 40, and a DC/DC converter 38. The system control unit 12 includes a cold plate 14, a battery charger 16, a motor controller 18, a power distribution module 20, and a chassis controller 22. The motor assembly 24 includes a resolver 26, a motor 28, and a filter 30. The cooling system 32 includes an oil pump unit 34 and a radiator/fan 36.

Figure 2:
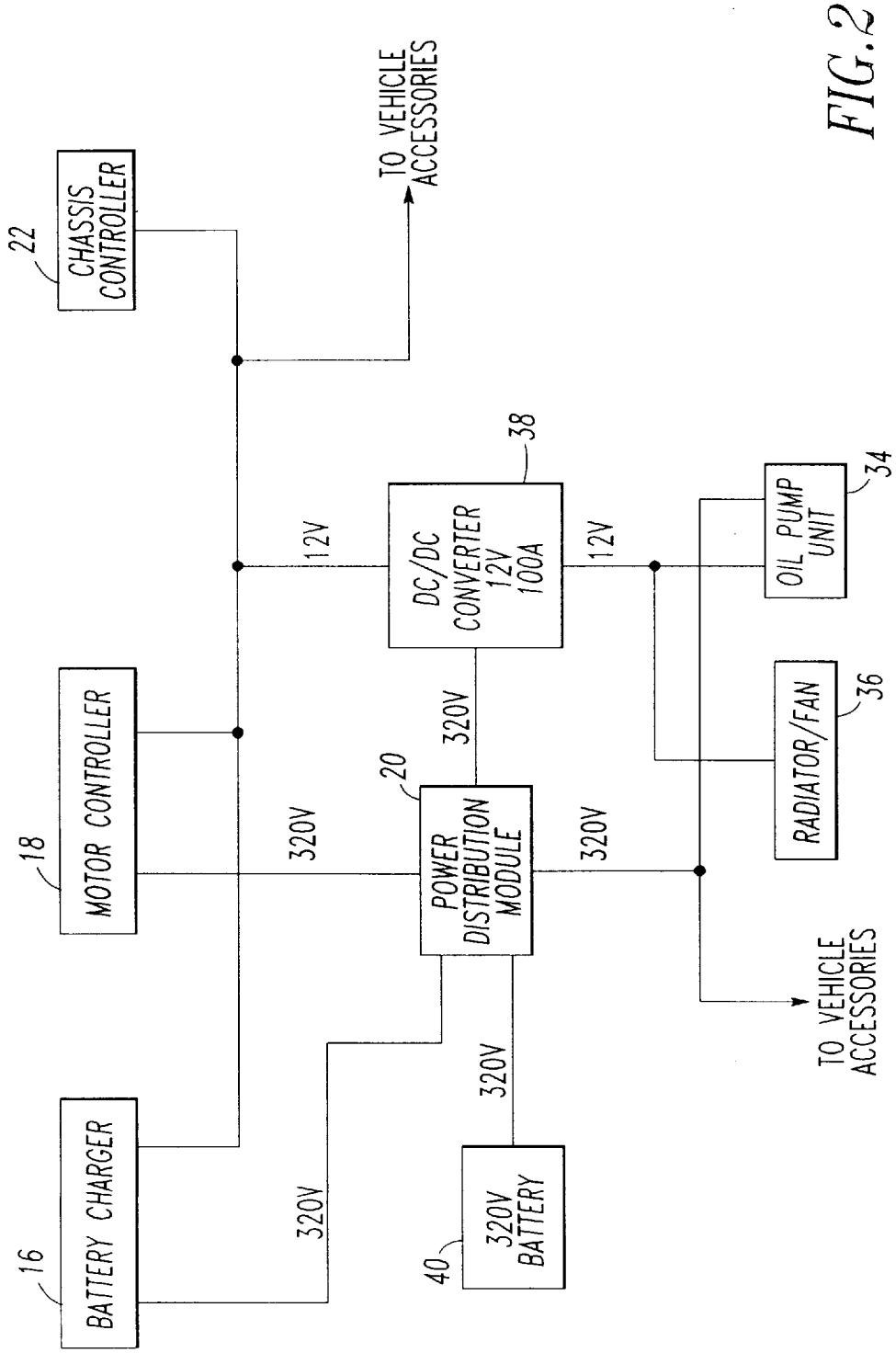
FIG. 2 is a power distribution diagram of the electric vehicle propulsion system of FIG. 1.

FIG. 2 is a power distribution diagram of the electric vehicle propulsion system 10. As shown in FIG. 2, the battery 40 serves as the primary source of power for the electric propulsion system 10. The battery 40 comprises, for example, a sealed lead acid battery, a monopolar lithium metal sulfide battery, a bipolar lithium metal sulfide battery, or the like, for providing a 320 volt output. Preferably, the electric propulsion system 10 works over a wide voltage range, e.g., 120 volts to 400 volts, to accommodate changes in the output voltage of the battery 40 due to load or depth of discharge. However, the electric vehicle propulsion system 10 is preferably optimized for nominal battery voltages of about 320 volts.

The power distribution module 20 is coupled to the output of the battery 40 and includes, among other things, fuses, wiring, and connectors for distributing the 320 volt output from the battery 40 to various components of the electric vehicle propulsion system 10. For example, the power distribution module 20 distributes the 320 volt output from the battery 40 to the motor controller 18, the DC/DC converter 38, the oil pump unit 34, and the battery charger 16. The power distribution module 20 also distributes the 320 volt output from the battery 40 to various vehicle accessories, which are external to the electric vehicle propulsion system 10. These vehicle accessories include, for example, an air conditioning system, a heating system, a power steering system, and any other accessories that may require a 320 volt power supply. Additional details concerning the power distribution module 20 are disclosed in copending U.S. patent application Ser. No. 08/258,157 (Westinghouse Case No. 58,346) entitled "ELECTRIC VEHICLE POWER DISTRIBUTION ASSEMBLY" filed on the same day as this application.

The DC/DC converter 38, which, as described above, is coupled to the 320 volt output of the power distribution module 20, converts the 320 volt output of the power distribution module 20 to 12 volts. The DC/DC converter 38 then supplies its 12 volt output as operating power to the battery charger 16, the motor controller 18, the chassis controller 22, the oil pump unit 34 and the radiator/fan 36. The DC/DC converter 38 also supplies its 12 volt output as operating power to various vehicle accessories, which are external to the electric vehicle propulsion system 10. These vehicle accessories include, for example, vehicle lighting, an audio system, and any other accessories that may require a 12 volt power supply. It should be appreciated that the DC/DC converter 38 eliminates the need for a separate 12 volt storage battery. Additional details concerning the DC/DC converter 38 are disclosed in copending U.S. patent application Ser. No. 08/208,142 (Westinghouse Case No. 58,333) entitled "AUTOMOTIVE 12 VOLT SYSTEM FOR ELECTRIC VEHICLES" and U.S. patent application Ser. No. 08/258,141 (Westinghouse Case No. 58,351) entitled "HEAT DISSIPATING TRANSFORMER COIL" filed on the same day as this application.

Figure 3:
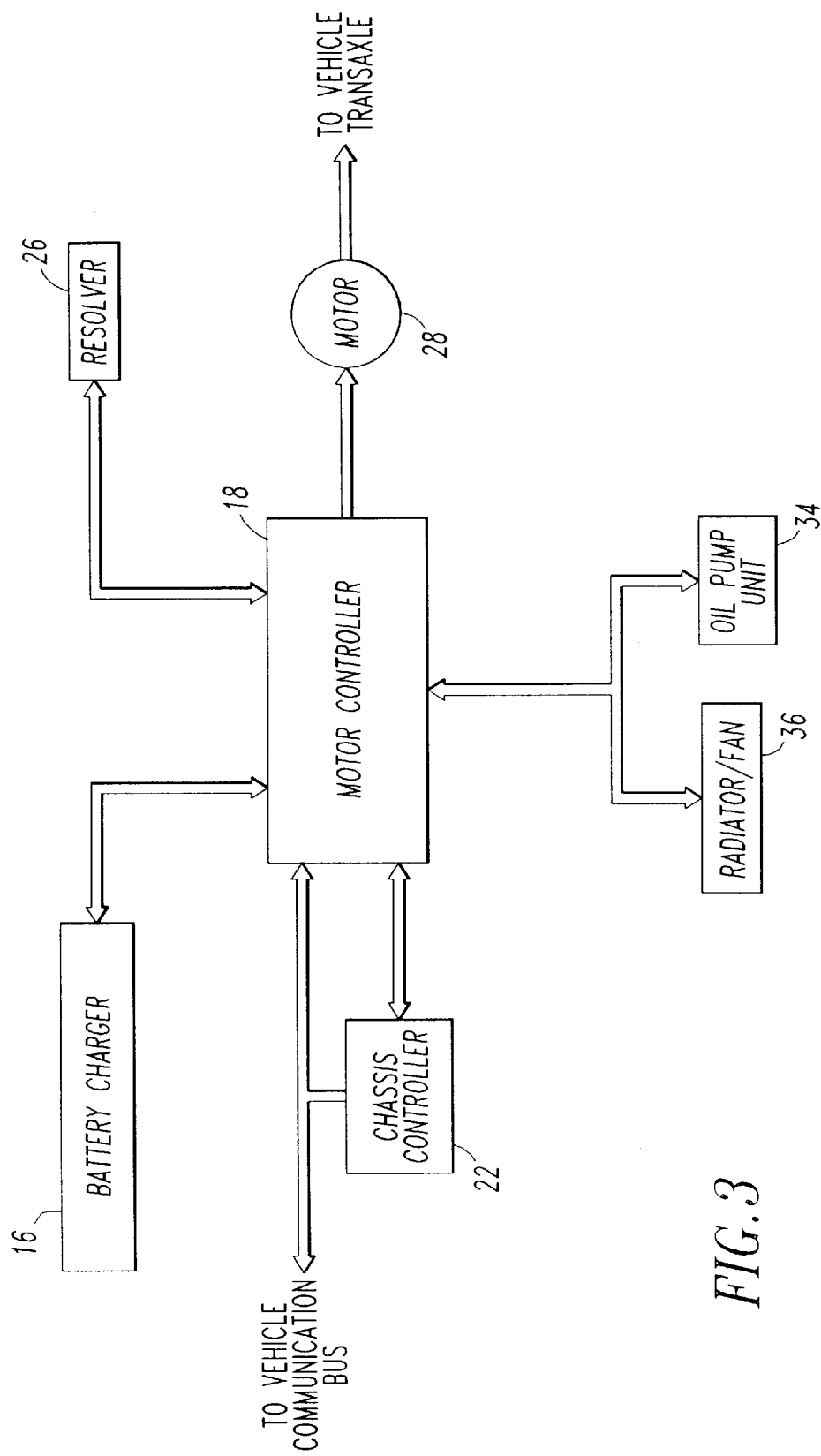
FIG. 3 is a functional diagram of the electric vehicle propulsion system of FIG. 1.
Figure 4:
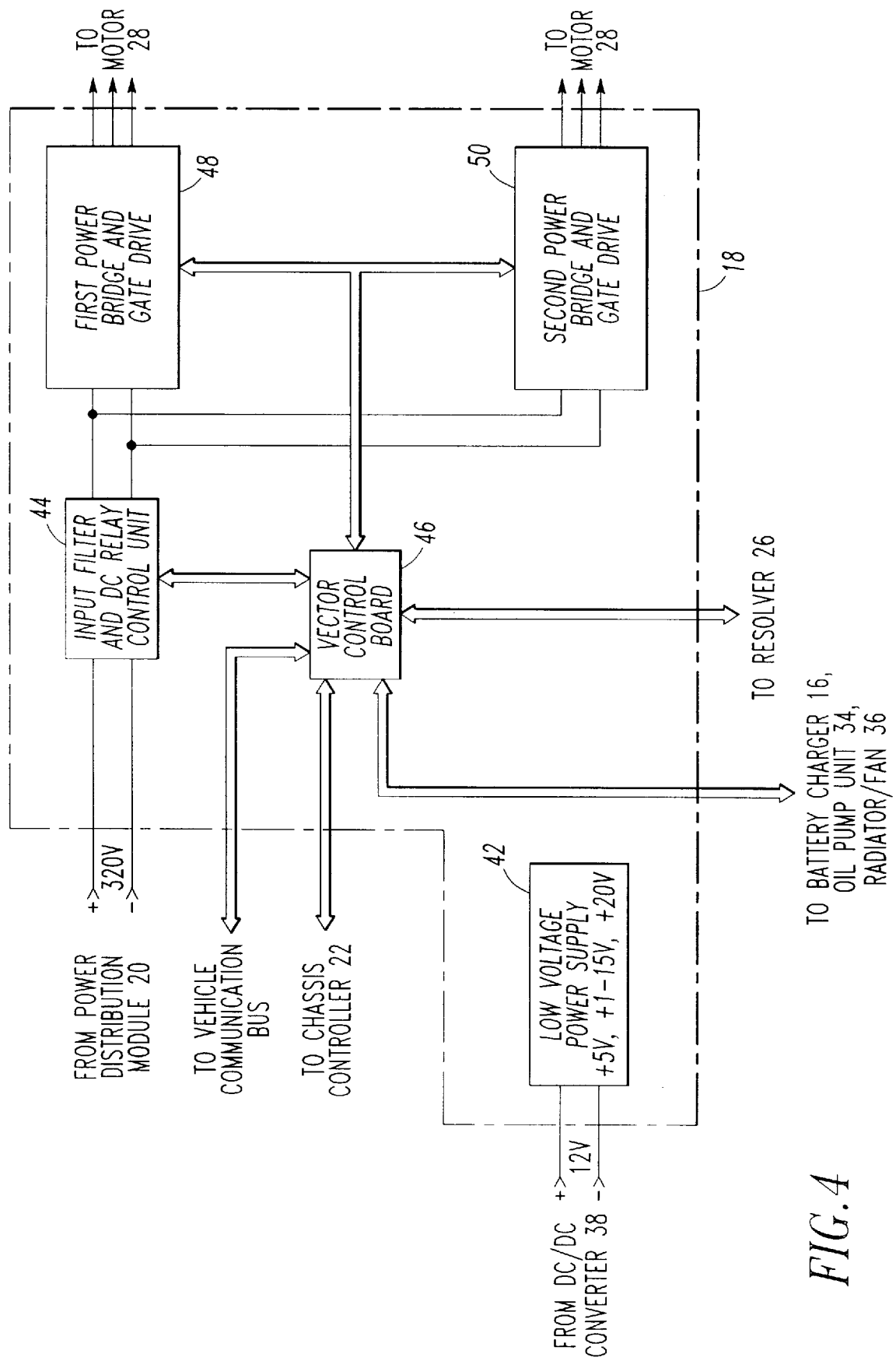
FIG. 4 is a functional diagram of the motor controller of the electric vehicle propulsion system of FIG. 1.

As shown in FIGS. 3 and 4, the components of the electric vehicle propulsion system 10 are interconnected via various data busses. The data busses can be of the electrical, optical, or electro-optical type as is known in the art. Operation of the electric vehicle propulsion system 10 will now be described with reference to FIGS. 3 and 4.

The battery charger 16 receives command signals from and sends status signals to the motor controller 18 for charging the battery 40. The battery charger 16 provides a controlled battery charging current from an external AC power source (not shown). Preferably, AC current is drawn from the external source at near-unity power factor and low harmonic distortion in compliance with expected future power quality standards. Further, the battery charger 16 is preferably designed to be compatible with standard ground fault current interrupters and single-phase power normally found at residential locations. Additional details concerning the battery charger 16 are disclosed in copending U.S. patent application Serial No. 08/258,154 (Westinghouse Case No. 58,352) entitled "ELECTRIC VEHICLE BATTERY CHARGER" filed on the same day as this application.

The oil pump unit 34 and radiator/fan 36 also receive command signals from and send status signals to the motor controller 18. As will be described in more detail below, the oil pump unit 34 and radiator/fan 36 are part of a closed loop oil cooling system for the electric vehicle propulsion system 10. Additional details concerning the oil pump unit 34 and radiator/fan 36 are disclosed in copending U.S. patent application Ser. No. 08/258,296 (Westinghouse Case No. 58,350) entitled "ELECTRIC VEHICLE COOLANT OIL PUMP" and copending U.S. patent application Ser. No. 08/258,294 (Westinghouse Case No. 58,336) entitled "SPEED CONTROL AND BOOTSTRAPPING TECHNIQUE" filed on the same day as this application.

Figure 5:
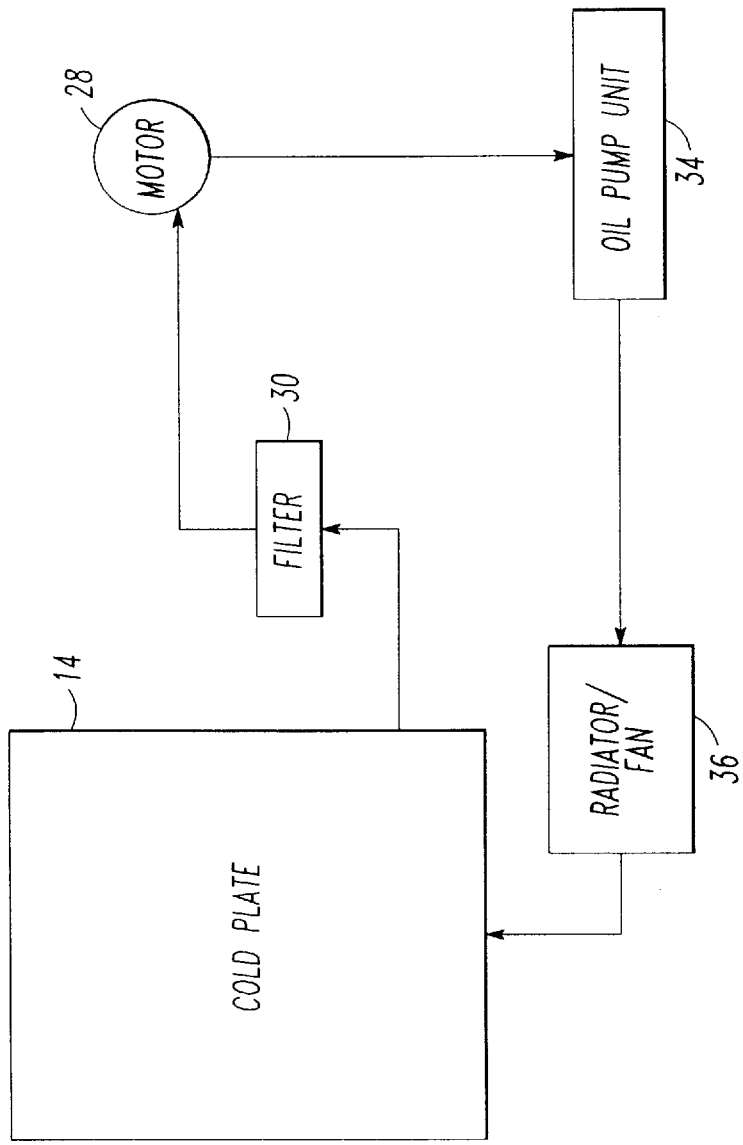
FIG. 5 is a cooling diagram of the electric vehicle propulsion system of FIG. 1.
Figure 5A:
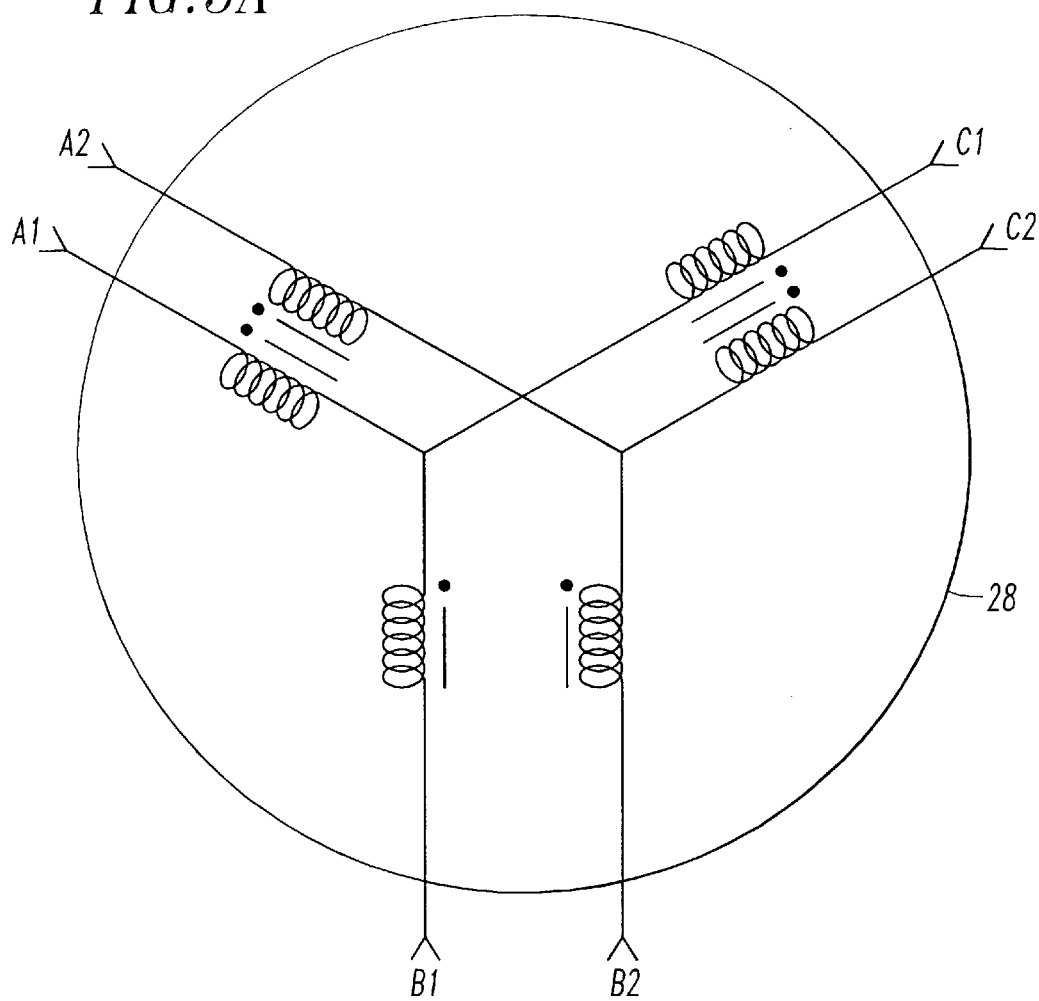
FIG. 5A is a schematic diagram of the motor of the electric vehicle propulsion system of FIG. 1.

As shown in FIG. 5A, the motor 28 is a 3-phase AC induction motor having two identical, electrically isolated, windings per phase (windings A1 and A2 are for the "A" phase, windings B1 and B2 are for the "B" phase, and windings C1 and C2 are for the "C" phase) for producing high torque at zero speed to provide performance comparable to conventional gas-driven engines. The rotor (not shown) of the motor 28 is coupled to the vehicle transaxle (not shown). Preferably, the two windings in each phase of the motor 28 are aligned substantially on top of one another and are electrically in phase such that each winding provides approximately half the total power of the phase. Also the motor 28 is preferably completely sealed and utilizes spray-oil cooling to remove heat directly from the rotor and end windings to increase reliability. Additional details concerning the motor 28 are disclosed in copending U.S. patent application Ser. No. 08/258,150 (Westinghouse Case No. 58,332) entitled "ELECTRIC VEHICLE MOTOR AND RELATED METHOD OF COOLING" filed on the same day as this application.

Figure 5B:
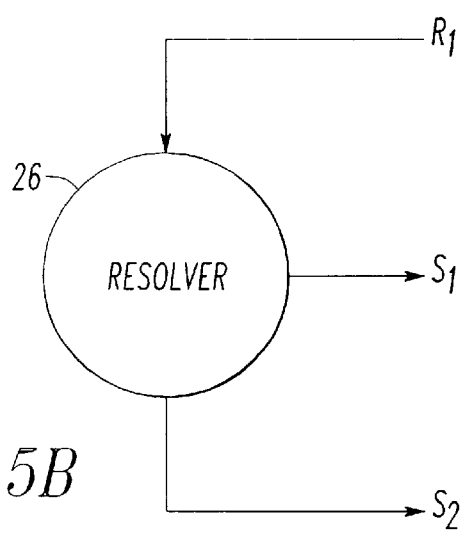
FIG. 5B is a schematic diagram of the resolver of the electric vehicle propulsion system of FIG. 1.

The resolver 26 is illustrated in FIG. 5B and is positioned proximate to the motor 28 for detecting the angular position of the motor shaft and for providing signals indicative of the angular position of the motor shaft to the motor controller 18. The reference signal line $R_1$ connected to the resolver is for a positive or negative reference value indicating the angular position of the motor shaft. The $S_1$ signal line from the resolver provides a positive or negative sine value for the angular position of the motor shaft and the $S_2$ signal line from the resolver provides a positive or negative cosine value for the angular position of the motor shaft.

The resolver 26 can comprise a commercially available resolver or other resolver known in the art. Reference signals for the resolver 26 are provided by the motor controller 18.

The chassis controller 22 and the motor controller 18 receive signals from a vehicle communication bus. Generally, the vehicle communication bus serves as a communication pathway for interfacing various vehicle sensors and controllers to the chassis controller 22 and the motor controller 18, as will be explained in more detail below.

The chassis controller 22 comprises a microprocessor-based digital and analog electronics system and provides control and status interfacing to the vehicle's sensors and controllers and to the motor controller 18. For example, the chassis controller 22 is connected, via the vehicle communication bus, to the vehicle key switch, accelerator, brake, and drive selector switches. The chassis controller 22 interprets signals from these switches to provide the motor controller 18 with start-up, drive mode (e.g., forward, reverse, and neutral), motor torque, regenerative braking, shutdown, and built-in test (BIT) commands. Preferably, the chassis controller 22 communicates with the motor controller 18 via an opto-coupled serial data interface and receives status signals from the motor controller 18 of all the commands sent to verify the communication links between the chassis controller 22, the vehicle, and the motor controller 18 and to verify that the vehicle is operating properly. It should be appreciated that because the chassis controller 22 provides the control and status interfacing to the vehicle's sensors and controllers and to the motor controller 18, the electric vehicle propulsion system 10 can be modified for use with any number of different vehicles simply by modifying the chassis controller 22 for a particular vehicle.

The chassis controller 22 also provides battery management capabilities by using signals received over the vehicle communication bus from a battery current sensor located in the power distribution module 20. The chassis controller 22 interprets signals from the battery current sensor, provides charging commands to the motor controller 18, and sends a state-of-charge value to a "fuel" gauge on the vehicle dashboard. The chassis controller 22 further connects, via the vehicle communication bus, to vehicle controllers including odometer, speedometer, lighting, diagnostic and emissions controllers, as well as to an RS-232 interface for system development. Additional details concerning the chassis controller 22 are disclosed in copending U.S. patent application Ser. No. 08/258,628 (Westinghouse Case No. 58,347) entitled "ELECTRIC VEHICLE CHASSIS CONTROLLER" filed on the same day as this application and which is hereby expressly incorporated by reference into this application.

As shown in FIG. 4, the motor controller 18 includes a low voltage power supply 42, an input filter and DC relay control unit 44, a vector control board 46, and first and second power bridges and gate drives 48 and 50, respectively.

The low voltage power supply 42 converts the 12 volt output from the DC/DC converter 38 to provide +5 V, +/–15 V, and +20 V outputs to the input filter and DC relay control unit 44, the vector control board 46, the first power bridge 48, and the second power bridge 50. The low voltage power supply 42 can comprise a commercially available power supply as is known in the art.

The input filter and DC relay control unit 44 includes electrical connections for coupling the 320 volt output of the power distribution module 20 to the first and second power bridges 48 and 50, respectively. The input filter and DC relay control unit 44 includes EMI filtering, a relay circuit for disconnecting the coupling of the 320 volt output of the power distribution module 20 to the first and second power bridges 48 and 50, respectively, and various BIT circuits including voltage sense circuits and a chassis ground fault circuit. Preferably, the input filter and DC relay control unit 44 receives control signals from and sends status signals, e.g., BIT signals, to the vector control board 46. Additional details concerning the input filter and DC relay control unit 44 are disclosed in copending U.S. patent application Ser. No. 08/258,153 (Westinghouse Case No. 58,340) entitled "IMPROVED EMI FILTER TOPOLOGY FOR POWER INVERTER;" copending U.S. patent application Ser. No. 08/258,179 (Westinghouse Case No. 58,341) entitled "FAULT DETECTION CIRCUIT TO SENSE LEAK CURRENTS;" and copending U.S. patent application Ser. No. 08/258,117 (Westinghouse Case No. 58,342) entitled "ELECTRIC VEHICLE RELAY ASSEMBLY" filed on the same day as this application.

Each of the first and second power bridges 48 and 50, respectively, includes insulated gate bipolar transistor (IGBT) switching circuits and associated gate drive circuits for applying drive currents to each of the windings of the motor 28. Preferably, each of the first and second power bridges 48 and 50, respectively, provides half the current to the windings of the motor 28, thereby allowing the use of readily available, low cost IGBT switching circuits. The first and second power bridges 48 and 50, respectively, receive control signals from and send status signals, e.g., BIT signals, to the vector control board 46. Additional details concerning the first and second power bridges 48 and 50, respectively, are disclosed in copending U.S. patent application Ser. No. 08/258,117 (Westinghouse Case No. 58,343) entitled "THREE PHASE POWER BRIDGE INTERCONNECT;" copending U.S. patent application Ser. No. 08/258,034 (Westinghouse Case No. 58,344) entitled "ELECTRIC VEHICLE PROPULSION SYSTEM POWER BRIDGE WITH BUILT-IN TEST;" and copending U.S. patent application Ser. No. 08/258,178 (Westinghouse Case No. 58,345) entitled "METHOD FOR TESTING A POWER BRIDGE FOR AN ELECTRIC VEHICLE PROPULSION SYSTEM" filed on the same day as this application.

The vector control board 46 comprises a microprocessor based digital and analog electronics system. As its primary function, the vector control board 46 receives driver-initiated acceleration and braking requests from the chassis controller 22. The vector control board 46 then acquires rotor position measurements from the resolver 26 and current measurements from the first and second power bridges 48 and 50, respectively, and uses these measurements to generate pulse width modulated (PWM) voltage waveforms for driving the first and second power bridges 48 and 50, respectively, to produce the desired acceleration or braking effects in the motor 28. The PWM voltage waveforms are generated in accordance with a control program which is designed to result in a requested torque output. As described above, the vector control board 46 also has the function of controlling the input filter and DC relay control unit 44, the oil pump unit 34, the radiator/fan 36, the battery charger 16, the input filter and DC relay control unit 44, built in test circuitry, vehicle communication, and fault detection. Additional details concerning the vector control board 46 are disclosed in copending U.S. patent application Ser. No. 08/258,295 (Westinghouse Case No. 58,295) entitled "FLAT TOPPING CIRCUIT;" copending U.S. patent application Ser. No. 08/258,306 (Westinghouse Case No. 58,337) entitled "VECTOR CONTROL BOARD FOR AN ELECTRIC VEHICLE PROPULSION SYSTEM MOTOR CONTROLLER"; copending U.S. patent application Ser. No. 08/258,305 (Westinghouse Case No. 58,338) entitled "DIGITAL PULSE WIDTH MODULATOR;" copending U.S. patent application Ser. No. 08/258,305 (Westinghouse Case No. 58,334) entitled "DIRECT COOLED IGBT MODULE;" and copending U.S. patent application Ser. No. 08/258,149 (Westinghouse Case No. 58,339) entitled "CONTROL MECHANISM FOR ELECTRIC VEHICLE" filed on the same day as this application. Additional details concerning the vector control board 46 are also disclosed in U.S. Pat. No. 5,291,388 entitled "RECONFIGURABLE INVERTER APPARATUS FOR BATTERY-POWERED VEHICLE DRIVE" issued on Ser. No. 08/258,154; U.S. Pat. No. 5,182,508 entitled "RECONFIGURABLE AC INDUCTION MOTOR DRIVE FOR A BATTERY-POWERED VEHICLE" issued on Jan. 26, 1993; U.S. Pat. No. 5,168,204 entitled "AUTOMATIC MOTOR TORQUE AND FLUX CONTROLLER FOR BATTERY-POWERED VEHICLE DRIVE" issued on Dec. 1, 1992; and U.S. Pat. No. 5,227,963 entitled "FLAT-TOP WAVEFORM GENERATOR AND PULSE-WIDTH MODULATOR USING SAME" issued on Jul. 13, 1993, which are hereby expressly incorporated by reference into this application.

As shown in FIG. 5, the electric vehicle propulsion system 10 utilizes a closed loop cooling system including the cold plate 14, the filter 30, the motor 28, the oil pump unit 34, and the radiator/fan 36. Preferably, the cold plate 14 is a hollow body having a double-sided surface on which the battery charger 16, the motor controller 18, and the power distribution module 20 are mounted in thermal contact. It is contemplated that the DC/DC converter 38 can also be mounted in thermal contact on the cold plate 14. The oil pump unit 34 circulates oil, e.g., aircraft turbine oil, from the oil reservoir of the motor 28 through the radiator/fan 36, the cold plate 14, the filter 30, and back through the motor 28 as shown in FIG. 5. Heat is removed from the oil by the radiator/fan 36 and the oil is filtered by the filter 30, which can comprise a commercially available oil filter known in the art. Preferably, the oil pump unit 34 is controlled by the motor controller 18 to provide a variable rate of oil flow.

It should be appreciated that the closed loop oil cooling system of FIG. 5 protects the electric vehicle propulsion system 10 from the harsh automotive operating environment, thus increasing reliability and reducing maintenance. Further, because the same oil used for lubricating the motor 28 is also used for cooling of the system control unit 12, the cooling system can have a simplified design. Additional details concerning the cold plate 14 and cooling system for the electrical propulsion system 10 are disclosed in copending U.S. patent application Ser. No. 08/258,156 (Westinghouse Case No. 58,348) entitled "ELECTRICAL VEHICLE SYSTEM CONTROL UNIT HOUSING" and copending U.S. patent application Ser. No. 08/258,299 (Westinghouse Case No. 58,349) entitled "LOW COST BOLT ON COLD PLATE" filed on the same day as this application.

It should be apparent to those skilled in the art that various modifications and variations can be made to the present invention without departing from the spirit or scope of the invention. Thus, it is intended that the present invention cover the modifications and variations of this invention provided they come within the scope of the appended claims and their equivalents.

We claim:

1. An electric vehicle propulsion system, comprising:

a motor assembly for propelling a vehicle including a 3-phase AC induction motor having first and second sets of identical, electrically isolated windings;

a system control unit having a motor controller including a vector control board responsive to driver initiated acceleration and braking commands for controlling the motor assembly, the system control unit further including a first and a second power bridge responsive to pulse width modulated control signals generated by the vector control board for respectively driving the first and second set of windings;

wherein the first power bridge includes a first set of insulated gate bipolar transistor (IGBT) switching circuits responsive to said pulse width modulated control signals for applying one half of the total drive currents to respective ones of the first set of windings, and wherein the second power bridge includes a second set of IGBT switching circuits responsive to said pulse width modulated control signals for applying the other half of the total drive currents to respective ones of the second set of windings; and cooling means comprising, a liquid coolant circulating cold plate on which said system control unit is mounted and being in thermal contact therewith, a pump controlled by said motor controller for pumping liquid coolant, a radiator/fan also controlled by said motor controller, and a filter for filtering said liquid coolant, wherein said cold plate, pump, radiator/fan, and filter form a closed loop cooling system for said coolant to cool the electric vehicle propulsion system.

2. The electric vehicle propulsion system of claim 1 wherein the liquid coolant comprises oil.

* * * * *